United States Patent
Jung et al.

(10) Patent No.: US 10,850,985 B2
(45) Date of Patent: Dec. 1, 2020

(54) METHOD OF FORMING NANOCRYSTALLINE GRAPHENE, AND DEVICE INCLUDING NANOCRYSTALLINE GRAPHENE

(71) Applicant: Samsung Electronics Co., Ltd., Suwon-si (KR)

(72) Inventors: Alum Jung, Suwon-si (KR); Keunwook Shin, Yongin-si (KR); Kyung-Eun Byun, Seongnam-si (KR); Hyeonjin Shin, Suwon-si (KR); Hyunseok Lim, Suwon-si (KR); Seunggeol Nam, Suwon-si (KR); Hyunjae Song, Hwaseong-si (KR); Yeonchoo Cho, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/233,513

(22) Filed: Dec. 27, 2018

(65) Prior Publication Data
US 2020/0039827 A1    Feb. 6, 2020

(30) Foreign Application Priority Data
Aug. 3, 2018 (KR) .................. 10-2018-0090903

(51) Int. Cl.
*H01L 29/12* (2006.01)
*C01B 32/186* (2017.01)
(Continued)

(52) U.S. Cl.
CPC .......... *C01B 32/186* (2017.08); *C23C 16/26* (2013.01); *C23C 16/505* (2013.01);
(Continued)

(58) Field of Classification Search
CPC ... C01B 32/186; C23C 16/505; C23C 16/511; C23C 16/26; H01L 21/0262;
(Continued)

(56) References Cited

U.S. PATENT DOCUMENTS

| 7,387,868 | B2 | 6/2008 | Jacobson et al. | |
| 7,776,445 | B2* | 8/2010 | Lee | B82Y 15/00 423/448 |
| 9,029,228 | B2* | 5/2015 | Seacrist | H01L 21/02458 257/643 |
| 9,202,684 | B2* | 12/2015 | Sumant | H01L 21/02376 |

(Continued)

FOREIGN PATENT DOCUMENTS

| CN | 107012443 A | 8/2017 |
| KR | 10-0969027 B1 | 7/2010 |
| KR | 10 2017 0070083 A | 6/2017 |

OTHER PUBLICATIONS

Zhang, L. et al., "Catalyst-Free Growth of Nanographene Films on Various Substrates," Nano Res., 2011 vol. 4, No. 3, pp. 315-321.
(Continued)

*Primary Examiner* — Vu A Vu
(74) *Attorney, Agent, or Firm* — Harness, Dickey & Pierce, P.L.C.

(57) ABSTRACT

A method of forming nanocrystalline graphene by a plasma-enhanced chemical vapor deposition process is provided. The method of forming nanocrystalline graphene includes arranging a protective layer on a substrate and growing nanocrystalline graphene directly on the protective layer by using a plasma of a reaction gas. The reaction gas may include a mixed gas of a carbon source gas, an inert gas, and hydrogen gas.

18 Claims, 11 Drawing Sheets

(51) Int. Cl.
  *C23C 16/26* (2006.01)
  *C23C 16/505* (2006.01)
  *C23C 16/511* (2006.01)
  *H01L 21/02* (2006.01)
  *H01L 29/16* (2006.01)
  *H01L 29/06* (2006.01)
  *H01L 29/04* (2006.01)

(52) U.S. Cl.
  CPC ........ *C23C 16/511* (2013.01); *H01L 21/0262* (2013.01); *H01L 21/02527* (2013.01); *H01L 21/02601* (2013.01); *H01L 29/04* (2013.01); *H01L 29/0665* (2013.01); *H01L 29/1606* (2013.01)

(58) Field of Classification Search
  CPC ........... H01L 29/1606; H01L 21/02601; H01L 29/0665; H01L 21/02527; H01L 29/04
  USPC ........................................................ 257/613
  See application file for complete search history.

(56) References Cited

U.S. PATENT DOCUMENTS

| | | |
|---|---|---|
| 9,391,024 B2 | 7/2016 | Xie et al. |
| 9,678,036 B2* | 6/2017 | Balandin .............. G01N 27/414 |
| 2003/0198895 A1 | 10/2003 | Toma et al. |
| 2005/0095828 A1 | 5/2005 | Schmidt et al. |
| 2013/0330523 A1* | 12/2013 | Zhang .................. C01B 32/186 |
| | | 428/195.1 |
| 2017/0092592 A1* | 3/2017 | Shin ...................... H01L 23/485 |
| 2017/0144888 A1* | 5/2017 | Chiu ..................... C01B 32/186 |

OTHER PUBLICATIONS

Hong, J. et al., "Graphene as an Atomically Thin Barrier to Cu Diffusion into Si," Nanoscale, 2014.

Shoeb, J. et al., "Damage by radicals and photons during plasma cleaning of porous low-k SiOCH. I. Ar/O2 and He/H2 plasmas," Journal of Vacuum Science & Technology A, 30(4), 2012.

* cited by examiner

METHOD OF FORMING NANOCRYSTALLINE GRAPHENE, AND DEVICE INCLUDING NANOCRYSTALLINE GRAPHENE

CROSS-REFERENCE TO RELATED APPLICATION

This application claims the benefit of Korean Patent Application No. 10-2018-0090903, filed on Aug. 3, 2018, in the Korean Intellectual Property Office, the disclosure of which is incorporated herein in its entirety by reference.

BACKGROUND

1. Field

The present disclosure relates to a method of forming nanocrystalline graphene, and a device including nanocrystalline graphene, and more particularly, to a method of directly growing and forming nanocrystalline graphene on a substrate, without using a catalyst, by using a plasma chemical vapor deposition method.

2. Description of Related Art

Recently, in the field of semiconductor devices, research on graphene has been actively conducted due to the demand to utilize new materials needed for thinner and novel barrier materials and to solve a problem of increased resistance due to the reduced width of metal wiring.

Graphene, which is a crystalline material having a hexagonal honeycomb structure, is connected by carbon atoms in two dimensions and has a very thin atomic-scale thickness. Such graphene may be synthesized by chemical vapor deposition (CVD) or may be obtained by peeling graphite layers one by one. Generally, graphene includes crystals having micrometer-sized dimensions. In addition, nanocrystalline graphene refers to graphene that includes crystals of nanometer-sized dimensions.

SUMMARY

According to an aspect of an embodiment, a method of forming nanocrystalline graphene may include arranging a substrate in a reaction chamber, the substrate containing a material having a certain permittivity or lower; forming a protective layer on the substrate; injecting into the reaction chamber a reaction gas that includes a mixture of a carbon source gas, an inert gas, and hydrogen gas; generating a plasma of the reaction gas in the reaction chamber; and growing a nanocrystalline graphene directly on a surface of the protective layer using the plasma of the reaction gas at a temperature of 700° C. or lower.

In some embodiments, the protective layer may include one selected from a self-assembled monolayer, graphene quantum dots (GQDs), boron nitride (h-BN), and $MX_2$. M may be a transition metal and X may be chalcogen element of a transition metal dichalcogenide monolayer (TMDC). The self-assembled monolayer may include one of an amorphous carbon layer, hexamethyldisilazane (HMDS), chlorotrimethylsilane (TMCS), and trichloromethylsilane (TCMS).

In some embodiments, the substrate may include at least one of silicon dioxide ($SiO_2$), carbon-doped $SiO_2$, silsesquioxane, hydrogen silsesquioxane (HSQ), or methyl silsesquioxane (MSQ).

In some embodiments, the plasma of the reaction gas may include radio frequency (RF) plasma or microwave (MW) plasma.

In some embodiments, a power for generating the plasma of the reaction gas may be in a range of about 10 W to about 4000 W.

In some embodiments, a volume ratio of the carbon source gas, the inert gas, and the hydrogen gas may be 1-20:0-100:0-100 during the growing the nanocrystalline graphene.

In some embodiments, a process temperature during the growing the nanocrystalline graphene may be 700° C. or less.

In some embodiments, a process pressure during the growing the nanocrystalline graphene may be in a range of about 0.005 Torr to about 10 Torr.

In some embodiments, the carbon source gas may include at least one of a hydrocarbon gas or a vapor of a liquid precursor containing carbon.

In some embodiments, the inert gas may include at least one of argon gas, nitrogen gas, helium gas, krypton gas, or xenon gas.

In some embodiments, the nanocrystalline graphene may include crystals of a size in a range of about 0.5 nm to about 70 nm.

In some embodiments, the forming the protective layer may form the protective layer only on a part of an upper surface of the substrate.

In some embodiments, the growing the nanocrystalline graphene may not form the nanocrystalline graphene on a part of the upper surface of the substrate on which the protective layer is not arranged.

In some embodiments, the method may further include growing a second nanocrystalline graphene on the upper surface of the substrate. The growing the nanocrystalline graphene directly on the surface of the protective layer may grow a first nanocrystalline graphene directly on the surface of the protective layer. A thickness of the second nanocrystalline graphene may be different from a thickness of the first nanocrystalline graphene formed on the upper surface of the protective layer by using a same process time of plasma-enhanced chemical vapor deposition.

According to an aspect of another embodiment, a device may include a substrate containing a material having a certain permittivity or lower; a protective layer on the substrate; and a nanocrystalline graphene on the protective layer.

In some embodiments, the protective layer may include one of a self-assembled monolayer, graphene quantum dots (GQDs), boron nitride (h-BN), and $MX_2$. M may be a transition metal and X is a chalcogen element of a transition metal dichalcogenide monolayer (TMDC). The self-assembled monolayer may include one of an amorphous carbon layer, hexamethyldisilazane (HMDS), chlorotrimethylsilane (TMCS), or trichloromethylsilane (TCMS).

In some embodiments, the substrate may include at least one of silicon dioxide ($SiO_2$), carbon-doped $SiO_2$, silsesquioxane, hydrogen silsesquioxane (HSQ), or methyl silsesquioxane (MSQ).

In some embodiments, the nanocrystalline graphene may be grown directly on a surface of the protective layer by using a process performed at a temperature of 700° C. or lower using a plasma of a reaction gas that includes a mixture of a carbon source gas, an inert gas, and hydrogen gas.

In some embodiments, the protective layer may be on only a part of an upper surface of the substrate.

In some embodiments, the nanocrystalline graphene may not be formed on a part of the upper surface of the substrate on which the protective layer is not arranged.

In some embodiments, the device may further include a second nanocrystalline graphene on the upper surface of the substrate. The nanocrystalline graphene on the protective layer may be a first nanocrystalline graphene on an upper surface of the protective layer. A thickness of first nanocrystalline graphene may be different from a thickness of the second nanocrystalline graphene.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
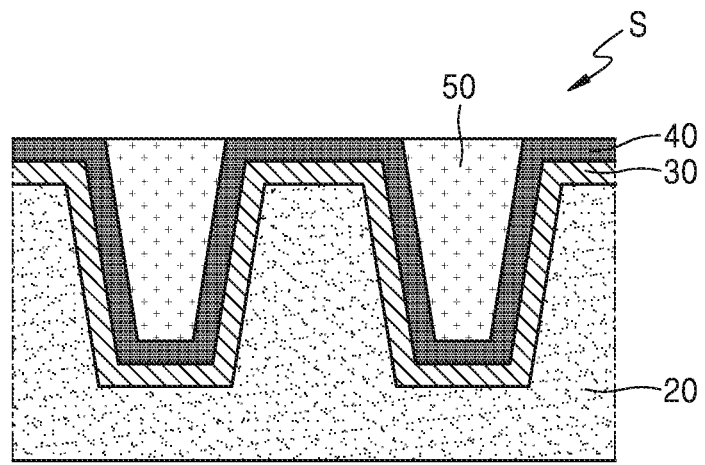
FIG. 1 is a cross-sectional view of a semiconductor device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. Expressions such as "at least one of," when preceding a list of elements, modify the entire list of elements and do not modify the individual elements of the list.

Hereinafter, embodiments will be described in detail with reference to the accompanying drawings. In the drawings followed, like reference numerals refer to like elements, and the size of each element in the drawings may be enlarged for clarity and convenience of explanation. The embodiments described below are merely illustrative, and various modifications may be made therein.

Meanwhile, in the following description, when an element is referred to as being "above" or "on" another element, it may not only be directly on the other element but also be above the other element in a non-contact manner. The singular forms are intended to include the plural forms unless the context clearly indicates otherwise. Also, it will be understood that the terms "comprises" and/or "comprising" used herein specify the presence of stated elements, and/or components, but do not preclude the presence or addition of one or more other elements, and/or components. An element referred to with the definite article or a demonstrative pronoun may be construed as the element or the elements even though it has a singular form.

In the following description, a method of growing nanocrystalline graphene on a surface of a substrate within a short period of time by using a plasma-enhanced chemical vapor deposition (PECVD) method will be described. Herein, the nanocrystalline graphene refers to graphene including crystals having a nano-scale size. General graphene includes crystals having a micrometer-scale size, while the nanocrystalline graphene may include crystals having a nanometer-scale size, for example, from about 0.5 nm to about 70 nm.

FIG. 1 is a cross-sectional view of a semiconductor device S according to an embodiment.

Referring to FIG. 1, the semiconductor device S may include a substrate 20, a protective layer 30 arranged on a surface of the substrate 20, a nanocrystalline graphene 40 which is grown on a surface of the protective layer 30, and a copper layer 50. Herein, the substrate 20 may include a material with a certain permittivity or lower, and the nanocrystalline graphene 40 may be utilized as a barrier layer between the substrate 20 and the copper layer 50.

Such a layer of the nanocrystalline graphene 40 may be grown on the surface of the substrate 20 or that of the protective layer 30 through a plasma chemical vapor deposition (PCVD) process as described above. In accordance with the present embodiment, the nanocrystalline graphene 40 may not be formed on the surface of the substrate 20, but may be formed only on the surface of the protective layer 30. As described above, since the nanocrystalline graphene 40 is formed only on the surface of the protective layer 30, the substrate 20 may be limited and/or prevented from being damaged from plasma, and the permittivity of the substrate 20 may be limited and/or prevented from increasing.

Hereinafter, a method of forming the nanocrystalline graphene 40 on the protective layer 30 through the PECVD method will be described.

FIGS. 2A to 2D are views for illustrating the method of forming the nanocrystalline graphene 40 according to an embodiment. FIG. 3 is a graph showing Fourier-transform infrared (FT-IR) spectroscopy data of a substrate on which the protective layer is not arranged, of a substrate on which the protective layer is arranged, of a substrate on which the protective layer is not arranged and which is damaged by radio frequency (RF) plasma, and of a substrate protected by the protective layer from the radio frequency (RF) plasma according to an embodiment.

Figure 2A:
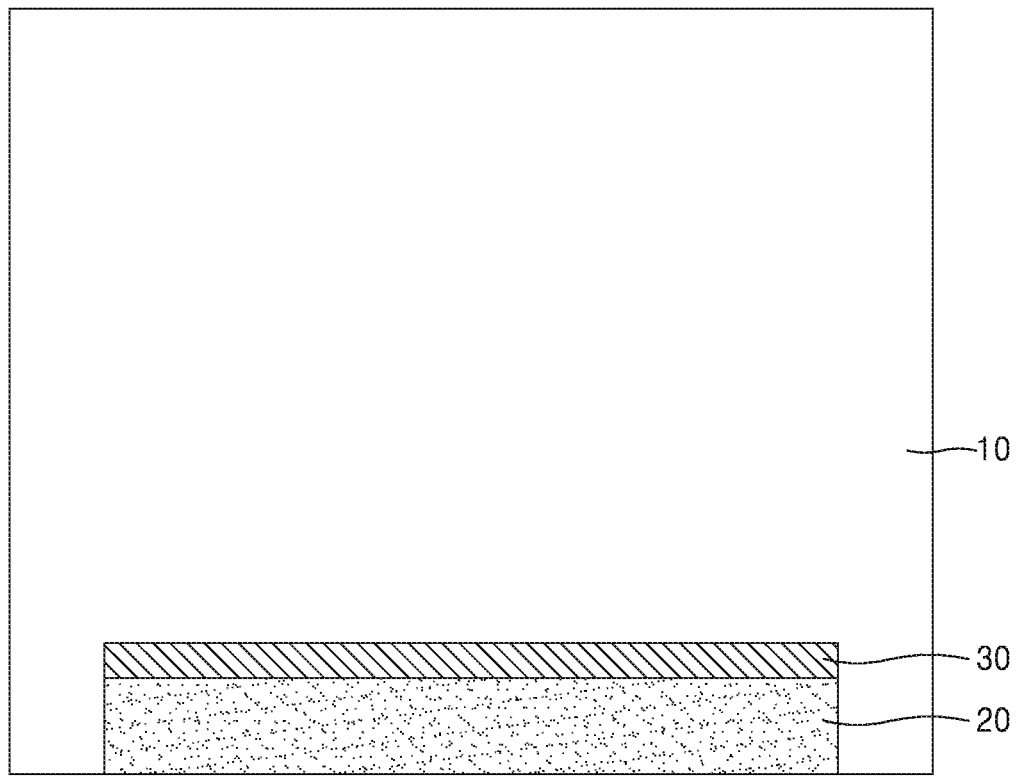
FIGS. 2A to 2D are views for illustrating a method of forming nanocrystalline graphene, according to an embodiment.
Figure 3:
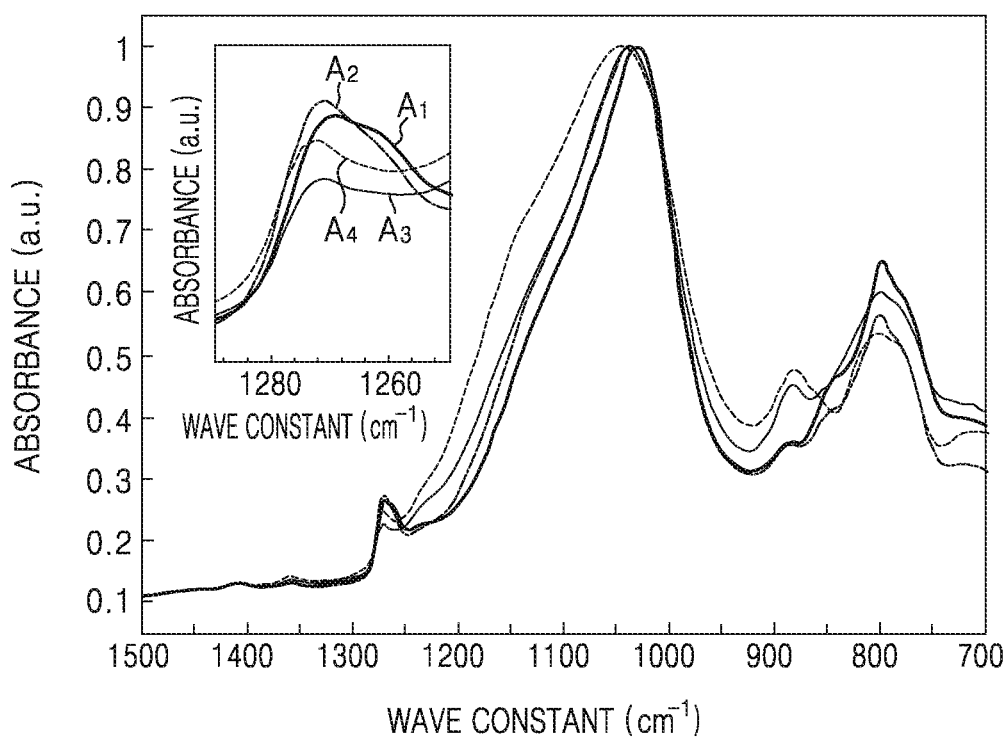
FIG. 3 is a graph showing Fourier-transform infrared (FT-IR) spectroscopy data of a substrate on which a protective layer is not arranged, of a substrate on which the protective layer is arranged, of a substrate on which the protective layer is not arranged and which is damaged by radio frequency (RF) plasma, and of a substrate protected by the protective layer from the radio frequency (RF) plasma, according to an embodiment.

Referring to FIG. 2A, the substrate 20 may be arranged within a reaction chamber 10, and the protective layer 30 may be arranged on the substrate 20. In accordance with one embodiment, the substrate 20 may include a material having a certain permittivity or lower. For example, the substrate 20 may include at least one of silicon dioxide ($SiO_2$), carbon-doped $SiO_2$, silsesquioxane, hydrogen silsesquioxane (HSQ), and methyl silsesquioxane (MSQ). Materials mentioned above are merely illustrative, and the substrate 20 may include various other materials as well.

The protective layer 30 may be arranged on the surface, for example, an upper surface, of the substrate 20, and may protect the substrate 20 from plasma of a reaction gas which is a mixture of a carbon source gas, an inert gas, and hydrogen gas that will be described later. To protect the substrate 20 from the plasma of the reaction gas, the protective layer 30 may be one selected from a self-assembled monolayer, graphene quantum dots (GQDs), boron nitride (h-BN), and $MX_2$ where M is a transition metal and X is a transition metal dichalcogenide monolayer (TMDC)

including a chalcogen element, wherein the self-assembled monolayer includes at least one of an amorphous carbon layer, hexamethyldisilazane (HMDS), chlorotrimethylsilane (TMCS), or trichloromethylsilane (TCMS).

Figure 2B:
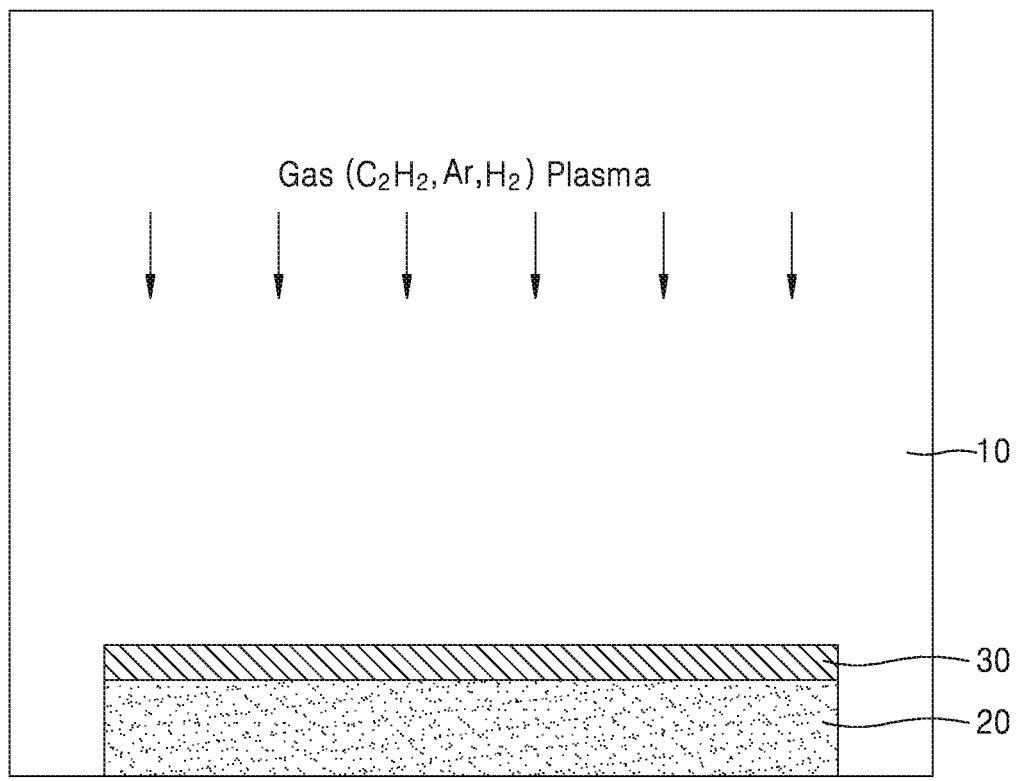

Referring to FIG. 2B, power to generate plasma may be supplied to the reaction chamber 10 equipped with the substrate 20 and the protective layer 30 therein, and the reaction gas to grow the nanocrystalline graphene 40 may be injected into the reaction chamber 10.

Subsequently, a power of generating the plasma inside the reaction chamber 10 is supplied from a plasma power source (not shown). Herein, the power of generating the plasma may be in a range of about 10 W to about 4000 W. However, the present disclosure is not limited thereto.

A radio frequency (RF) power source or a microwave (MW) power source, for example, may be used as the plasma power source.

When the power of generating the plasma inside the reaction chamber is supplied from the plasma power source, an electric field may be induced inside the reaction chamber. The reaction gas for growing the nanocrystalline graphene 40 is injected into the reaction chamber in a state that the electric field is induced as described above.

A mixed gas of the carbon source gas, the inert gas and the hydrogen gas may be used as the reaction gas for growing the nanocrystalline graphene 40. The carbon source gas may be a gas that provides carbon for the growth of the nanocrystalline graphene 40. For example, the carbon source gas may include at least one of hydrocarbon gas and vapor of liquid precursor containing carbon. The hydrocarbon gas may include at least one of, for example, methane gas, ethylene gas, and propylene gas, but it is not limited thereto. And the liquid precursor may include at least one of, for example, toluene, benzene, anisole and ethanol. The inert gas may include at least one of, for example, argon gas, nitrogen gas, helium gas, krypton gas, and xenon gas. FIG. 2B illustrates by example a case in which acetylene gas is used as the carbon source gas and the argon gas is used as the inert gas.

When the nanocrystalline graphene 40 is to be grown using the plasma, a volume ratio of the carbon source gas, the inert gas, and the hydrogen gas that are injected into the reaction chamber may be, for example, approximately 1-20:0-100:0-100. Herein, the volume ratio of the carbon source gas, the inert gas, and the hydrogen gas included in the reaction gas may be appropriately adjusted according to growth conditions, for example, growth temperature or the like.

Process temperature for growing the nanocrystalline graphene 40 may be about 700° C. or therebelow, which is less than a temperature used for a general chemical vapor deposition process. In detail, the process temperature inside the reaction chamber may be from about 300 to about 700° C.

And process pressure for growing the nanocrystalline graphene 40 may be in a range of about 0.005 Torr to about 10 Torr. However, this is merely illustrative and other process pressures may be used.

As described above, when the reaction gas which is the mixture of the carbon source gas, the inert gas and the hydrogen gas is injected into the reaction chamber 10, the reaction gas is changed into a state of the plasma by the electric field induced by applying the plasma power source.

Figure 2C:
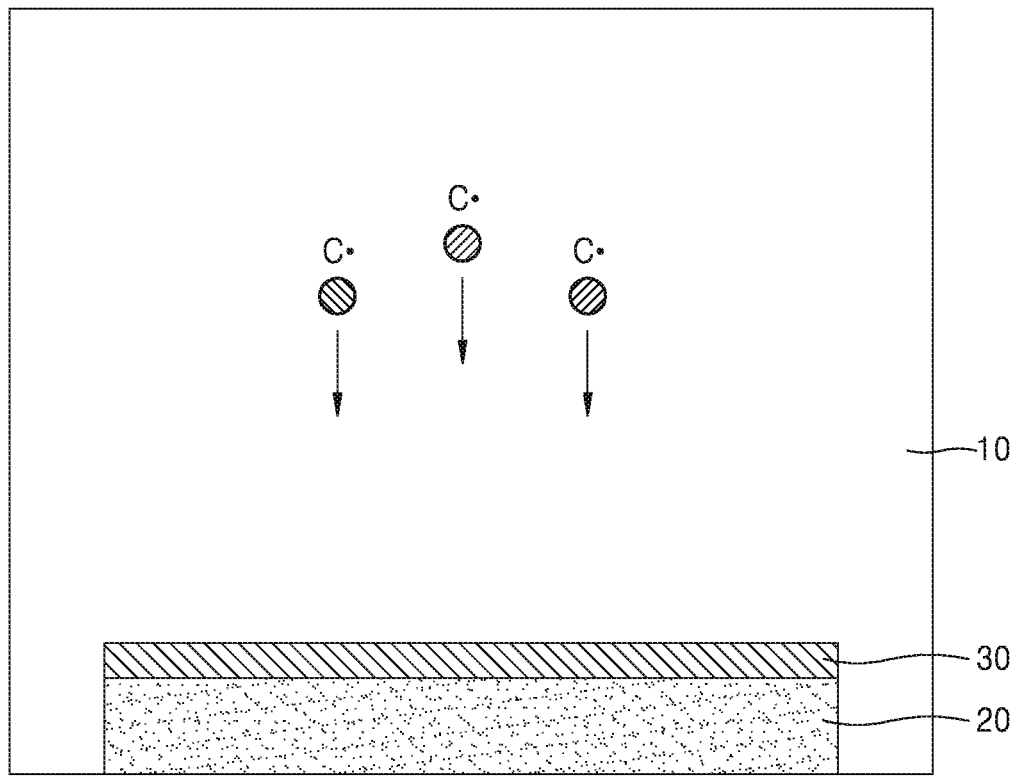

Referring to FIG. 2C, activated carbon radicals (C.) may be generated by the plasma of the reaction gas which is the mixture of the carbon source gas, the inert gas, and the hydrogen gas, and may be adsorbed on the surface of the protective layer 30. Specifically, the plasma of the inert gas among the reaction gas may generate the activated carbon radical (C.) from the carbon source gas, and the activated carbon radical (C.) generated may be adsorbed on the surface of the protective layer 30, thereby activating the surface of the protective layer 30. And, the plasma of the inert gas may continuously induce the activation of the protective layer 30, so that the adsorption of the activated carbon radical (C.) on the surface of the protective layer 30 may be accelerated. On the other hand, the substrate 20 arranged under the protective layer 30 is not damaged by the plasma due to the protective layer 30 and thus may limit and/or prevent an increase of the permittivity thereof.

As an example, when the substrate 20 is formed by using a porous hydrogenated SiOCH thin film and no separate protective layer is arranged on the substrate 20, the surface of the substrate 20 may be changed to be hydrophilic by a methyl group ($-CH_3$) of hydrogenated SiOCH being etched by the plasma of the inert gas. The substrate 20 hydrophilically deformed may readily react with water ($H_2O$) and thus the dielectric constant (K) may increase. Therefore, the dielectric constant (K) may increase when the substrate 20 containing the material having the certain permittivity or lower is damaged by the plasma of the inert gas. On the other hand, when the protective layer 30 is arranged on the substrate 20, the substrate 20 may not be damaged by the plasma of the inert gas. Accordingly, the permittivity of the substrate 20 may not be increased.

As an example, referring to FIG. 3, the substrate 20 is formed by a porous hydrogenated SiOCH thin film, and the protective layer 30 is arranged as the amorphous carbon layer. A RF power source (13.58 MHz) is used as the plasma power source acting on the substrate 20 or the protection layer 30, and a power for generating the RF plasma is 50 W. The growth temperature of 400° C., the process pressure of 0.02 Torr, and a growth time of 30 minutes are used as the growth conditions. The acetylene gas, the inert gas, and hydrogen gas included in the reaction gas may be respectively used by an amount of 5 sccm of the acetylene gas, 95 sccm of the argon gas, and 5 sccm of the hydrogen gas.

Herein, Fourier-transform infrared (FT-IR) spectroscopy data related to data A1 of a substrate 20 on which the protective layer 30 is not arranged, data A2 of a substrate on which the protective layer 30 is arranged, data A3 of a substrate 20 on which the protection layer 30 is not arranged and which is damaged by the radio frequency (RF) plasma, and data A4 of a substrate 20 protected by the protection layer 30 from the RF plasma may be measured, Referring to the data above, it may be confirmed that a reduction amount of the methyl group ($-CH_3$) is decreased by the fact that the substrate 20 is damaged by the plasma of the inert gas as the protective layer 30 is provided onto the substrate 20. Therefore, it may be confirmed that the surface of the substrate 20 may be limited and/or prevented from being deformed to be hydrophilic for the methyl group ($-CH_3$) being etched. Accordingly, increasing the dielectric constant K of the substrate 20, due to the surface of the substrate 20 deforming to be hydrophilic, may be limited and/or prevented.

Moreover, when the protective layer 30 is formed of the amorphous carbon layer, due to that adsorption energy of the activated carbon radical (C.) and the surface of the amorphous carbon film is lower than the adsorption energy of the activated carbon radical (C.) and the surface of the substrate 20 containing silicon oxide or the like, the activated carbon radical (C.) may be adsorbed on the surface of the protective layer 30 at a faster rate than the activated carbon radical (C.) is adsorbed on the surface of the substrate 20.

Figure 2D:
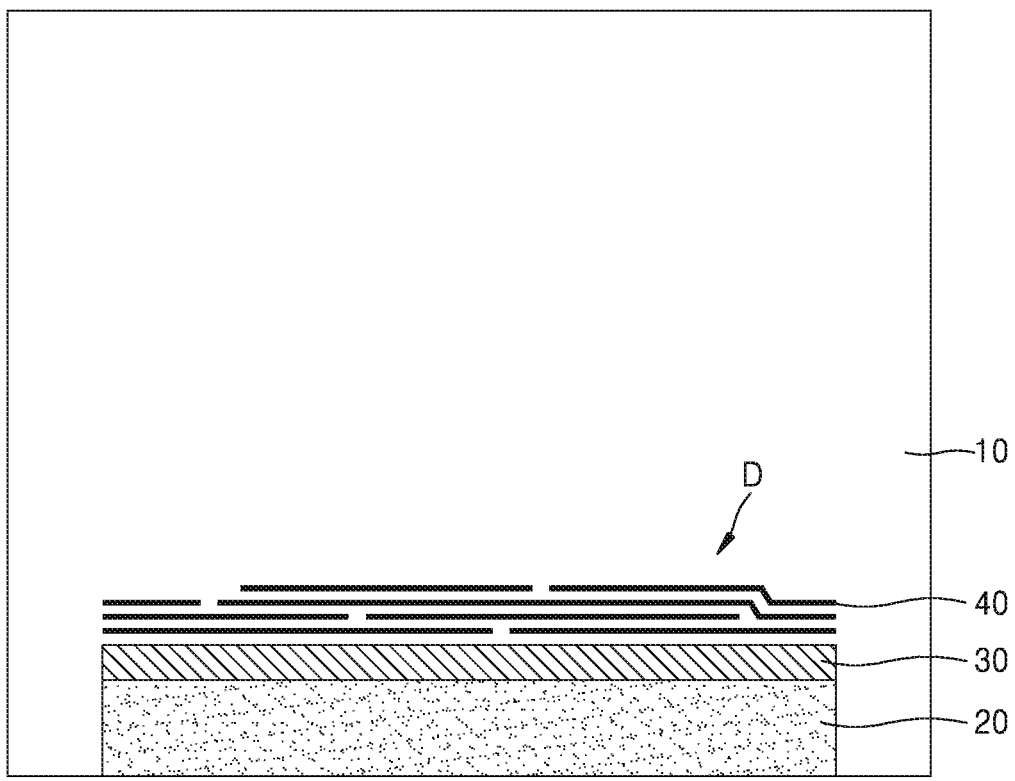

Referring to FIG. 2D, as described above, as adsorption of the activated carbon radical (C.) on the surface of the protective layer 30 is accelerated, the nanocrystalline graphene 40 may be grown and formed on the surface of the protective layer 30 within a short period of time.

Accordingly, the nanocrystalline graphene 40 may be grown at a faster speed on the surface of the protective layer 30. For example, the nanocrystalline graphene 40 may be grown on the surface of the protective layer 30 to a thickness of 0.05 nm or more per minute. However, it is not limited thereto. Accordingly, the nanocrystalline graphene 40 may be grown to an expected thickness within a relatively short time. For example, the time for growing the nanocrystalline graphene 40 on the surface of the protective layer 30 may be, for example, 60 minutes or less. More specifically, the time for which the nanocrystalline graphene 40 is grown may be 30 minutes or less or 10 minutes or less. However, it is not limited thereto. Likewise, the nanocrystalline graphene 40 of the expected thickness may be directly formed on the surface of the protective layer 30 within a relatively short period of time due to the plasma of the inert gas. Such nanocrystalline graphene 40 may have a structure of single layer or multiple layers.

As described above. the nanocrystalline graphene 40 is grown on the substrate 20 on which the protective layer 30 is arranged so that the device (D) including the substrate 20 containing the material having the certain permittivity or lower, the protective layer 30 arranged on the substrate 20, and the nanocrystalline graphene 40 arranged on the protective layer 30 may be formed.

According to the present embodiment, the mixed gas of the carbon source gas, the inert gas, and the hydrogen gas is used as the reaction gas in the plasma chemical vapor deposition process, and the nanocrystalline graphene 40 may be grown directly on the surface of the protective layer 30 within a relatively short period of time by the plasma of the inert gas among the mixed gas even at relatively low temperatures about 700° C. or less. Herein, the substrate 20 arranged under the protective layer 30 may be protected from the plasma of the inert gas, thereby limiting and/or preventing an unnecessary increase of the permittivity thereof.

FIGS. 4A to 4D are views for illustrating a method of forming the nanocrystalline graphene 40 according to another embodiment. FIG. 5 is a view for illustrating a method of forming the nanocrystalline graphene 40 according to another embodiment.

Figure 4A:
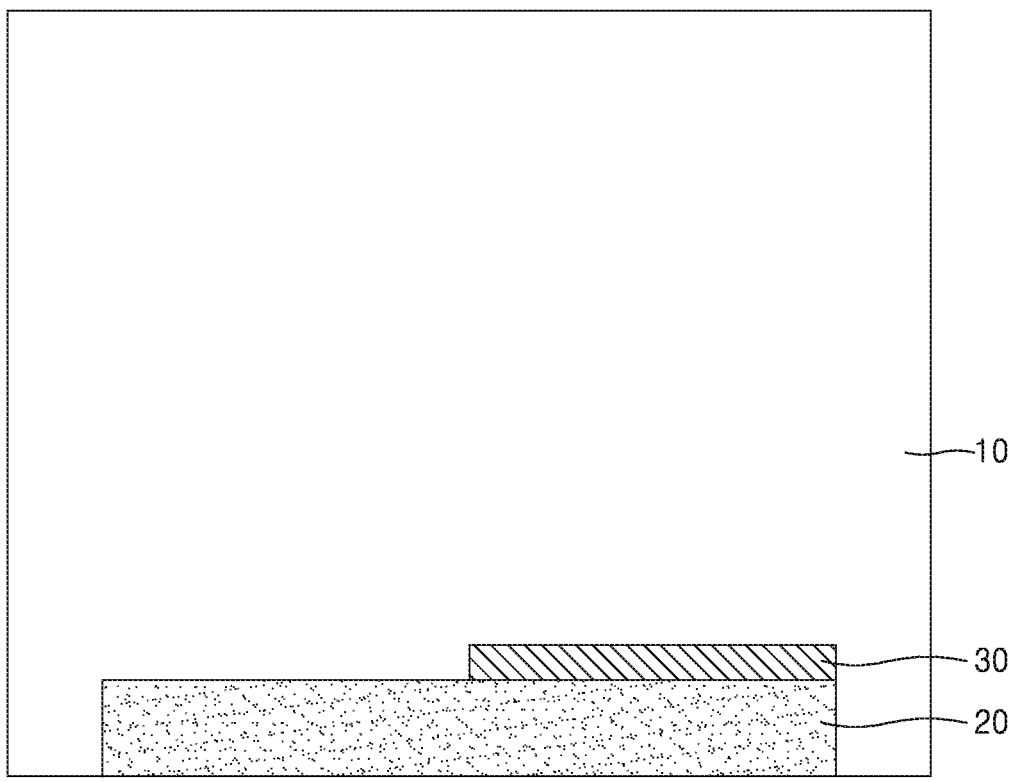
FIGS. 4A to 4D are views for illustrating a method of forming nanocrystalline graphene according to another embodiment.
Figure 4B:
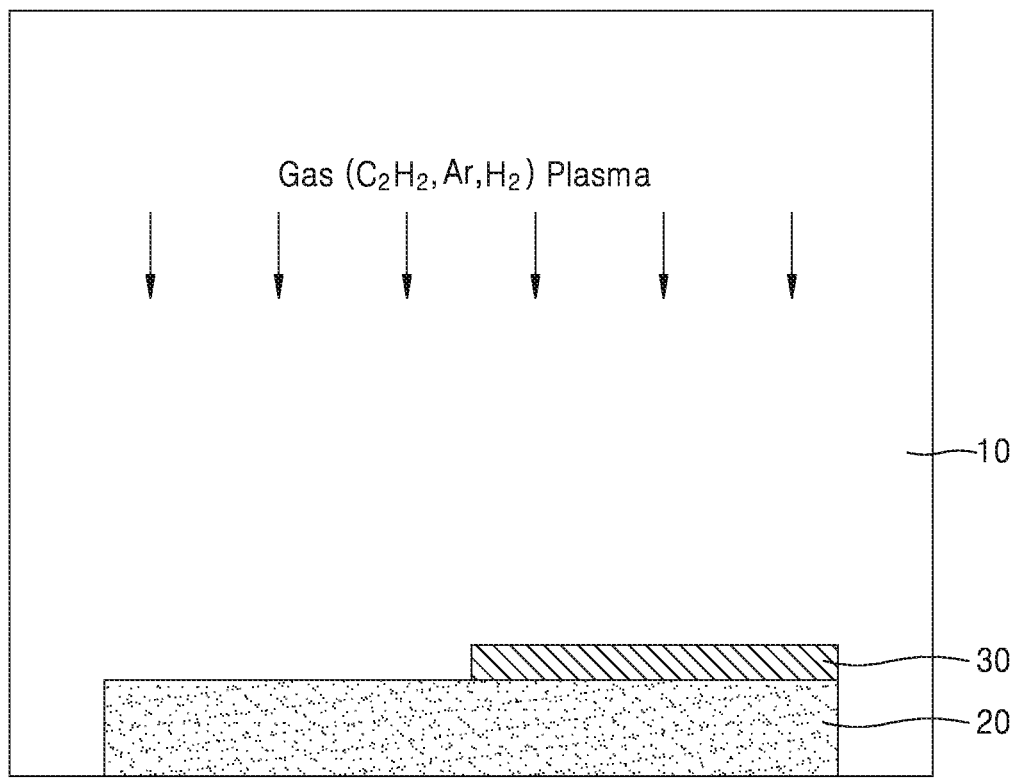
Figure 5:
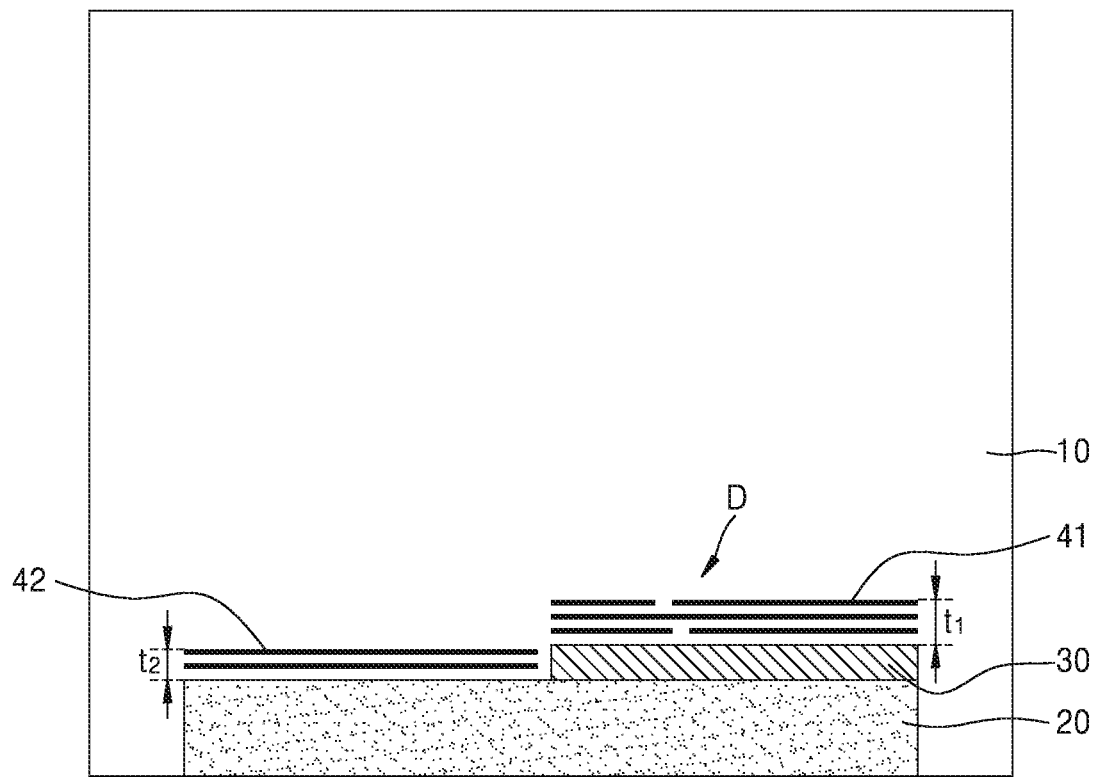
FIG. 5 is a view for illustrating a method of forming nanocrystalline graphene, according to another embodiment.

Referring to FIG. 4A, the substrate 20 is arranged inside the reaction chamber 10, and the protective layer 30 is arranged on a part of the upper surface of the substrate 20. Referring to FIG. 4B, power is applied to generate the plasma inside the reaction chamber 10 which is arranged with the substrate 20 and the protective layer 30, and the reaction gas for the growth of the nanocrystalline graphene 40 is injected into the reaction chamber 10. According to an example, the process of applying the power for generating the plasma to the substrate 20 and the protective layer 30 and the process of injecting the reaction gas into the reaction chamber are virtually same as processes described in FIGS. 2A and 2B, and thus the description will be omitted here.

Figure 4C:
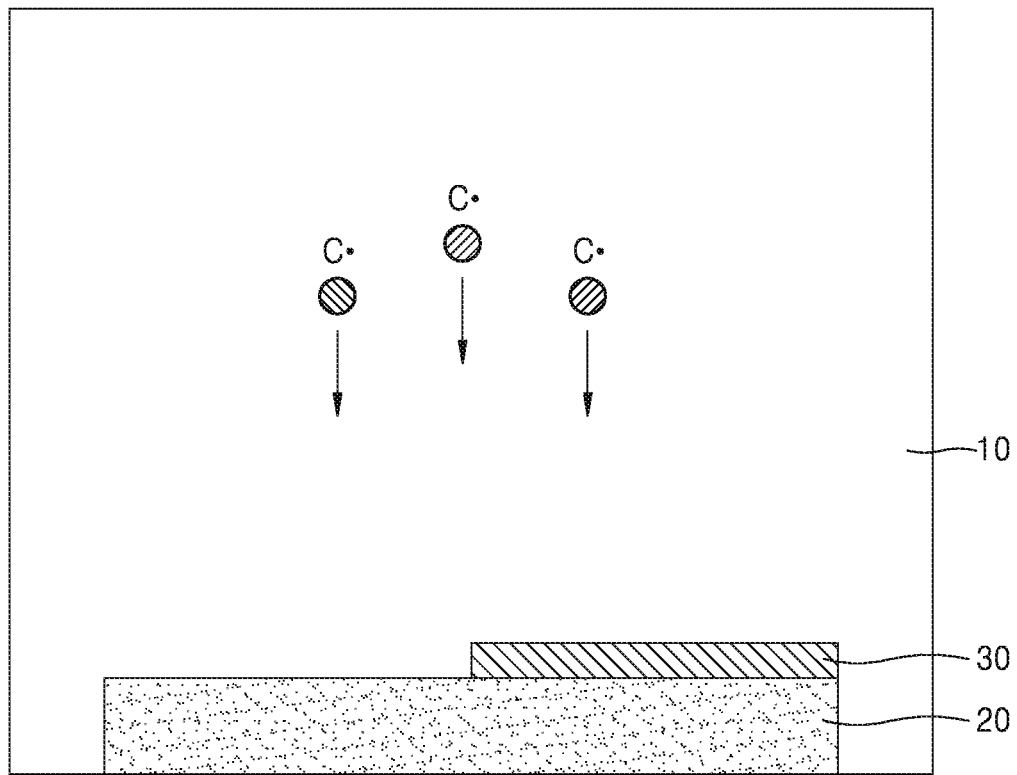

Referring to FIG. 4C, the activated carbon radical (C.) is generated by the plasma of the reaction gas which is the mixture of the carbon source gas, the inert gas, and the hydrogen gas and is adsorbed on the surface of the protective layer 30. Specifically, the plasma of the inert gas among the reaction gas generates the activated carbon radical (C.) from the carbon source gas, and the activated carbon radical (C.) generated is adsorbed on the surface of the protective layer 30, thereby activating the surface of the protective layer 30. And, the adsorption of the activated carbon radical (C.) on the surface of the protective layer 30 may be accelerated by the plasma of the inert gas continuously inducing the activation of the protective layer 30.

For example, when the protective layer 30 is formed of the amorphous carbon film, due to the fact that adsorption energy of the activated carbon radical (C.) and the surface of the amorphous carbon film is lower than the adsorption energy of the activated carbon radical (C.) and the surface of the substrate 20 containing silicon oxide or the like, the activated carbon radical (C.) may be adsorbed on the surface of the protective layer 30 at a faster rate than the activated carbon radical (C.) is adsorbed on the surface of the substrate 20. Accordingly, carbon radical (C.) may be adsorbed on the surface of the protective layer 30 while the carbon radical (C.) may not be adsorbed on the surface of the substrate 20 which is not covered by the protective layer 30.

Figure 4D:
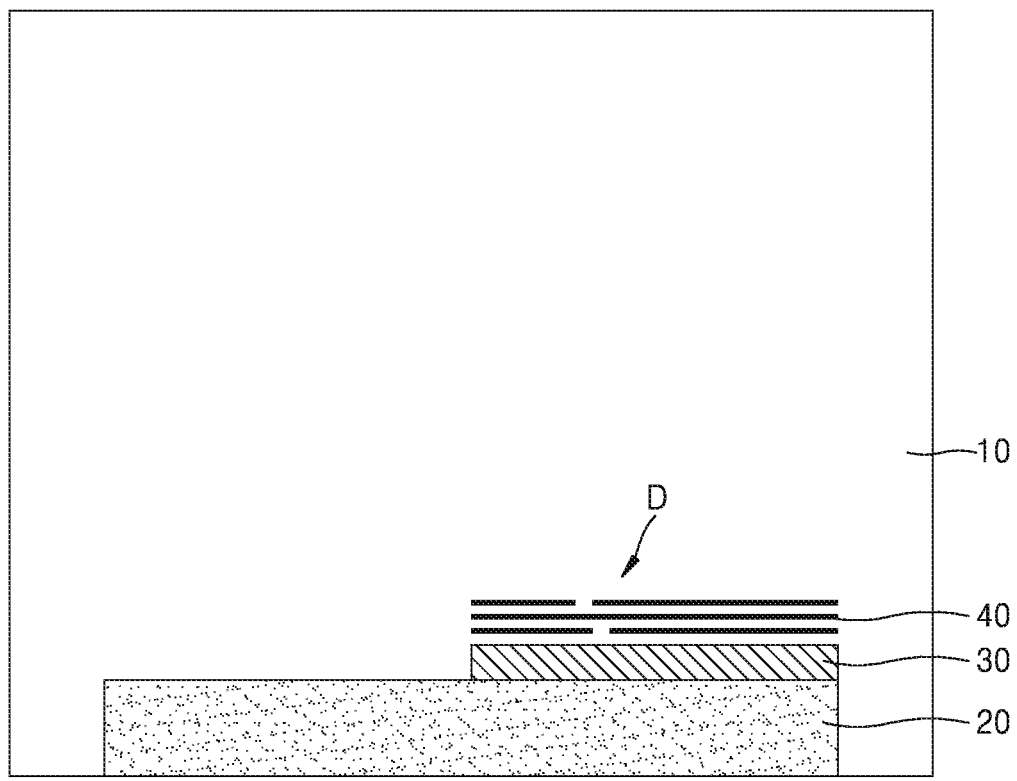

Referring to FIG. 4D, as described above, as the adsorption of the activated carbon radical (C.) on the surface of the protective layer 30 is accelerated, the nanocrystalline graphene 40 may be selectively grown and formed only onto the surface of the protective layer 30 within a short period of time. Accordingly, the adsorption of the carbon radical (C.) on the surface of the protection layer 30 is accelerated while the carbon radical (C.) is not adsorbed on the surface of the substrate 20 not covered by the protective layer 30 or the rate of the adsorption of the carbon radical (C.) may be slow. In the present embodiment, since the nanocrystalline graphene 40 is not formed on the surface of the substrate 20 but is formed only on the surface of the protective layer 30, the nanocrystalline graphene 40 may be formed and shaped in a certain pattern on the surface of the substrate 20. As described above, the device (D) including the nanocrystalline graphene 40 formed only on the surface of the protective layer 30 may be implemented by adjusting the growth time in the plasma chemical vapor deposition process.

In addition, when the growth time is adjusted in the plasma chemical vapor deposition process, a plurality of nanocrystalline graphenes having different thicknesses from each other may be formed on the surface of the substrate 20 and on the surface of the protective layer 30. For example, as shown in FIG. 5, when the growth time is adjusted in the plasma chemical vapor deposition process, first nanocrystalline graphene 41 having first thickness t1 is arranged on the upper surface of the protective layer 30, and second nanocrystalline graphene 42 having second thickness t2 may be arranged on the upper surface of the substrate 20. Herein, the first thickness t1 of the first nanocrystalline graphene 41 arranged on the upper surface of the protective layer 30 may be greater than the second thickness t2 of the second nanocrystalline graphene 42 arranged on the upper surface of the substrate 20.

According to the embodiments mentioned above, the mixed gas of the carbon source gas, the inert gas, and the hydrogen gas is used as the reaction gas in the plasma chemical vapor deposition process, and the nanocrystalline graphene 40 may be grown and formed directly on the surface of the protective layer 30 at a relatively short period of time by the plasma of the inert gas among the mixed gas even at a relatively low temperature about 700° C. or less. Herein, the substrate 20 arranged under the protective layer 30 may be protected from the plasma of the inert gas, thereby limiting and/or preventing the unnecessary increase of the permittivity thereof.

Moreover, it may be feasible to arrange a layer of the nanocrystalline graphene 40 selectively formed on the surface of the protective layer 30 and on the surface of the substrate 20. Herein, when the growth time is adjusted in the plasma chemical vapor deposition process, the layer of the nanocrystalline graphene 40 may be formed only on the surface of the protective layer 30, or the layer of the nanocrystalline graphene 40 may be formed to have respectively different thicknesses on the surface of the substrate 20 and on the surface of the protective layer 30. Accordingly, the layer of the nanocrystalline graphene 40 may be selectively grown pursuant to the structure of the protective layer 30 arranged on the substrate 20, and thus a graphene layer may be formed only on an expected region of the substrate 20 and that of the protective layer 30.

Techniques of directly growing the nanocrystalline graphene 40 on the surface of the substrate 20 at the relatively low temperature without the catalyst may be applied to a Complementary Metal-Oxide-Semiconductor (CMOS) process, so that it may be applied to form an element of a semiconductor device such as a barrier metal or the source/drain contact or the like, or to manufacture a pellicle of an exposure apparatus or the like.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A method of forming nanocrystalline graphene, the method comprising:
   arranging a substrate in a reaction chamber;
   forming a protective layer on the substrate;
   injecting into the reaction chamber a reaction gas that includes a mixture of a carbon source gas, an inert gas, and hydrogen gas;
   generating a plasma of the reaction gas in the reaction chamber; and
   growing a nanocrystalline graphene directly on a surface of the protective layer using the plasma of the reaction gas at a temperature of 700° C. or lower, wherein
   the protective layer includes one selected from a self-assembled monolayer, graphene quantum dots (GQDs), boron nitride (h-BN), and $MX_2$, wherein
   M is a transition metal and X is a chalcogen element of a transition metal dichalcogenide monolayer (TMDC), and
   the self-assembled monolayer includes one of an amorphous carbon layer, hexamethyldisilazane (HMDS), chlorotrimethylsilane (TMCS), or trichloromethylsilane (TCMS).

2. The method of claim 1, wherein
   the substrate includes at least one of silicon dioxide ($SiO_2$), carbon-doped $SiO_2$, silsesquioxane, hydrogen silsesquioxane (HSQ), or methyl silsesquioxane (MSQ).

3. The method of claim 1, wherein
   the plasma of the reaction gas includes radio frequency (RF) plasma or microwave (MW) plasma.

4. The method of claim 1, wherein
   a power for generating the plasma of the reaction gas is in a range of about 10 W to about 4000 W.

5. The method of claim 1, wherein
   a volume ratio of the carbon source gas, the inert gas, and the hydrogen gas is 1-20:0-100:0-100 during the growing the nanocrystalline graphene.

6. The method of claim 1, wherein
   a process pressure during the growing the nanocrystalline graphene is in a range of about 0.005 Torr to about 10 Torr.

7. The method of claim 1, wherein
   the carbon source gas includes at least one of a hydrocarbon gas or a vapor of a liquid precursor containing carbon.

8. The method of claim 1, wherein
   the inert gas includes at least one of argon gas, nitrogen gas, helium gas, krypton gas, or xenon gas.

9. The method of claim 1, wherein
   the nanocrystalline graphene includes crystals of a size in a range of about 0.5 nm to about 70 nm.

10. The method of claim 1, wherein
    the forming the protective layer forms the protective layer only on a part of an upper surface of the substrate.

11. The method of claim 10, wherein
    the growing the nanocrystalline graphene does not form the nanocrystalline graphene on a part of the upper surface of the substrate on which the protective layer is not arranged.

12. The method of claim 10, further comprising:
    growing a second nanocrystalline graphene on the upper surface of the substrate, wherein
    the growing the nanocrystalline graphene directly on the surface of the protective layer grows a first nanocrystalline graphene directly on the surface of the protective layer,
    a thickness of the second nanocrystalline graphene is different from a thickness of the first nanocrystalline graphene formed on the upper surface of the protective layer, by using a same process time of plasma-enhanced chemical vapor deposition.

13. A device including nanocrystalline graphene, the device comprising:
    a substrate;
    a protective layer on the substrate; and
    a nanocrystalline graphene on the protective layer, the nanocrystalline graphene including crystals having a size in a range from 0.5 nm to about 70 nm, wherein
    the protective layer includes one selected from a self-assembled monolayer, graphene quantum dots (GQDs), boron nitride (h-BN), and $MX_2$,
    M is a transition metal and X is a chalcogen element of a transition metal dichalcogenide monolayer (TMDC), and
    the self-assembled monolayer includes one of an amorphous carbon layer, hexamethyldisilazane (HMDS), chlorotrimethylsilane (TMCS), or trichloromethylsilane (TCMS).

14. The device of claim 13, wherein
    the substrate includes at least one of silicon dioxide ($SiO_2$), carbon-doped $SiO_2$, silsesquioxane, hydrogen silsesquioxane (HSQ), or methyl silsesquioxane (MSQ).

15. The device of claim 13, wherein
    the nanocrystalline graphene is grown directly on a surface of the protective layer by using a process performed at a temperature of 700° C. or lower using a plasma of a reaction gas that includes a mixture of a carbon source gas, an inert gas, and hydrogen gas, wherein the substrate includes at least one of carbon-doped $SiO_2$, silsesquioxane, hydrogen silsesquioxane (HSQ), or methyl silsesquioxane (MSQ), the protective layer includes one selected from the self-assembled monolayer, the graphene quantum dots (GQDs), and the $MX_2$.

16. The device of claim 13, wherein
the protective layer is only on a part of an upper surface of the substrate.

17. The device of claim 16, wherein
the nanocrystalline graphene is not formed on a part of the upper surface of the substrate on which the protective layer is not arranged.

18. A device including nanocrystalline graphene, the device comprising:

a substrate;

a protective layer on the substrate, the protective layer being on only a part of an upper surface of the substrate;

a nanocrystalline graphene on the protective layer; and a second nanocrystalline graphene on the upper surface of the substrate, wherein the nanocrystalline graphene on the protective layer is a first nanocrystalline graphene on an upper surface of the protective layer, and a thickness of first nanocrystalline graphene is different from a thickness of the second nanocrystalline graphene.

* * * * *